United States Patent
Knowles (10) Patent No.: US 6,522,208 B1
(45) Date of Patent: Feb. 18, 2003

(54) OSCILLATOR AND METHOD FOR GENERATING A FREQUENCY WITHIN A STABLE FREQUENCY RANGE

(75) Inventor: Kenneth R. Knowles, Manassas, VA (US)

(73) Assignee: BAE Systems Information and Electronic Systems Integration, Inc., Manassas, VA (US)

( * ) Notice: Subject to any disclaimer, the term of this patent is extended or adjusted under 35 U.S.C. 154(b) by 0 days.

(21) Appl. No.: 09/705,978

(22) Filed: Nov. 3, 2000

Related U.S. Application Data
(60) Provisional application No. 60/163,757, filed on Nov. 3, 1999.

(51) Int. Cl.[7] .............................. H03B 5/24; H03B 5/04
(52) U.S. Cl. ......................... 331/34; 331/57; 331/175; 331/176; 331/177 R
(58) Field of Search ........................ 331/34, 57, 177 R, 331/175, 176

(56) References Cited

U.S. PATENT DOCUMENTS

| | | | | |
|---|---|---|---|---|
| 5,017,807 A | * | 5/1991 | Kriz et al. ................... 307/443 |
| 5,469,120 A | * | 11/1995 | Nguyen et al. ......... 331/177 R |
| 5,760,657 A | * | 6/1998 | Johnson ...................... 331/175 |
| 5,969,577 A | * | 10/1999 | Kaneko ........................ 331/57 |

\* cited by examiner

*Primary Examiner*—David C. Mis
(74) *Attorney, Agent, or Firm*—Daniel J. Long; Graybeal Jackson Haley LLP (57) ABSTRACT

An oscillator includes an oscillator circuit that receives a control signal having a signal level. The oscillator circuit generates an oscillator signal having a frequency that is proportional to the signal level and that is within a frequency range. A compensation circuit stabilizes the oscillator circuit such that the frequency range includes first and second predetermined frequencies. Thus, such an oscillator can be used to generate an oscillator signal having a first frequency in one application and having a second frequency in another application. The compensation circuit stabilizes the frequency range of the oscillator signal so that it includes the first and second frequencies over broad ranges of operating conditions such as temperature and supply voltage and over broad ranges of component characteristics such as gate dielectric thickness.

33 Claims, 5 Drawing Sheets

OSCILLATOR AND METHOD FOR GENERATING A FREQUENCY WITHIN A STABLE FREQUENCY RANGE

This application claims the benefit of No. 60/163,757, filed Nov. 3, 1999.

TECHNICAL FIELD

The invention relates generally to electronic circuits and more particularly to a signal-controlled oscillator and a method for generating an oscillator-output signal having a frequency that lies within a stable frequency range.

BACKGROUND OF THE INVENTION

To save time and resources, integrated-circuit (IC) manufacturers often use similarly or identically designed subcircuits in different applications, such as in different versions of an IC. For example, a manufacturer may include similarly designed oscillators in all versions of a microprocessor. Or, the manufacturer may use similarly designed memory-cores in all versions of a memory chip. Because the time and costs associated with creating, testing, and troubleshooting a single circuit design are significantly less than those associated with creating, testing, and troubleshooting multiple circuit designs, the manufacturer saves significant engineering time and costs by using similarly designed subcircuits in multiple versions of an IC.

Unfortunately, similarly or identically designed subcircuits may not operate. properly in all applications. For example, suppose that first and second versions of an IC operate at different internal clock frequencies and the manufacturer wants to use similarly designed oscillators in both IC versions. Therefore, each similarly designed oscillator must be capable of generating two different frequencies; a first frequency for the first IC version and a second frequency for the second IC version. But unfortunately, such oscillators are often unable to generate one or both of the first and second frequencies if operating conditions, such as temperature and supply voltage, or component characteristics, such as the thicknesses of transistor gate dielectrics, vary from ideal levels and the difference between the first and second frequencies is large. That is, under ideal conditions, such an oscillator can generate a signal within a frequency range that includes both the first and second frequencies. But if operating conditions or component characteristics are not ideal, then the frequency range of the oscillator signal may shift or shrink such that it includes none or only one of the first and second frequencies.

SUMMARY OF THE INVENTION

In one aspect of the invention, an oscillator includes an oscillator circuit that receives a control signal having a signal level. The oscillator circuit generates an oscillator signal having a frequency that is proportional to the signal level and that is within a frequency range. A compensation circuit stabilizes the oscillator circuit such that the frequency range includes first and second predetermined frequencies.

Thus, such an oscillator can be used to generate an oscillator signal having a first frequency in one application and having a second frequency in another application. The compensation circuit stabilizes the frequency range of the oscillator signal so that it includes the first and second frequencies over broad ranges of operating conditions such as temperature and supply voltage and over broad ranges of component characteristics such as gate dielectric thickness.

DETAILED DESCRIPTION OF THE INVENTION

Figure 1:
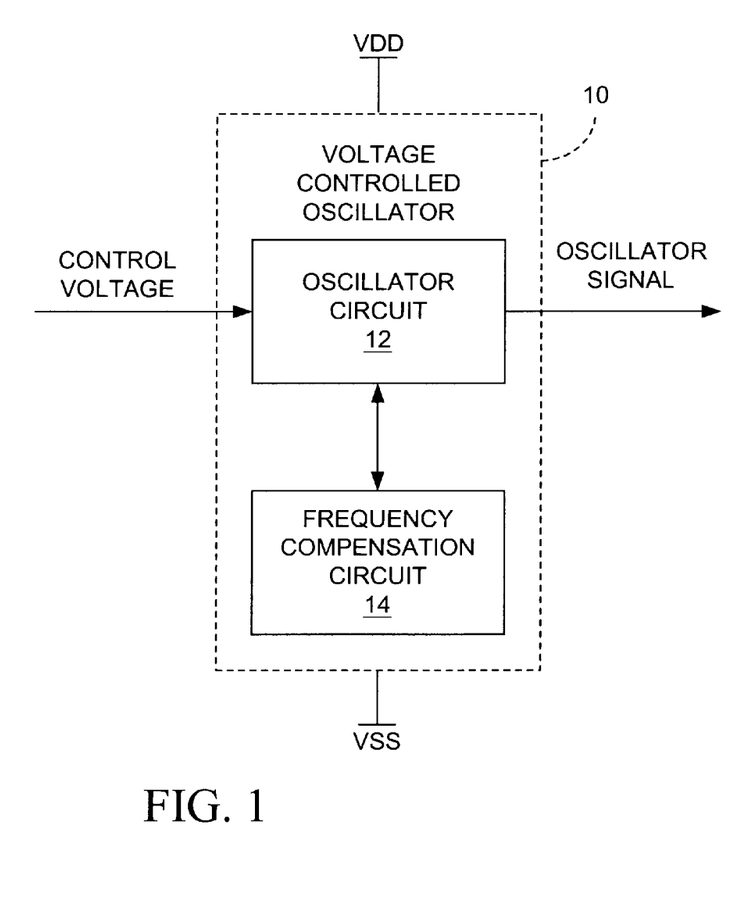
FIG. 1 is a general block diagram of an oscillator according to an embodiment of the invention.

FIG. 1 is a block diagram of an oscillator 10, which includes an oscillator circuit 12 and a compensation circuit 14 according to an embodiment of the invention. The oscillator 10 is designed such that it oscillates at a first frequency in a first application and a second frequency in a second application. An advantage of the oscillator 10 is that it can be used in respective IC versions that operate at different clock frequencies. In the embodiment described below, the oscillator 10 is a voltage-controlled oscillator (VCO), although in other embodiments it may be a current-controlled oscillator (CCO).

The oscillator circuit 12 receives a control signal—a control voltage in this embodiment—and generates an oscillator signal having a frequency that corresponds to the level of the control signal. Disregarding the compensation circuit 14 for the moment, the frequency of the oscillator signal is within a frequency range that depends on the operating conditions and component characteristics of the circuit 12 and that corresponds to the range of the control signal. For example, in one embodiment, the oscillator 10 is designed to oscillate at 266 MHz and 333 MHz in first and second versions of an IC, respectively. That is, the oscillator circuit 12 is designed to generate the oscillator signal at 266 MHz if the control signal has a first level and to generate the oscillator signal at 333 MHz if the control signal has a second level. In one embodiment, the frequency range of the oscillator signal includes both 266 MHz and 333 MHz when the circuit 12 has nominal component characteristics and operates at room temperature, Vdd≅2.5 V and Vss≅0 V, and the first and second control-signal levels are within a range of approximately 0–2.5 V. But unfortunately, as discussed below, variations in operating temperature, component characteristics, or supply voltage may cause the oscillator circuit 12 to shift or narrow the oscillator-signal frequency range such that it no longer includes both 266 MHz and 333 MHz. Consequently, if the excluded frequency is 266 MHz, then the affected first versions of the IC operate improperly, and if the excluded frequency is 333 MHz, then the affected second versions of the IC operate improperly.

Still referring to FIG. 1, the compensation circuit 14 stabilizes the oscillator circuit 12 such that the frequency range of the oscillator signal includes both the first and second frequencies over operating-condition and component-characteristic ranges that are significantly wider than those provided by the uncompensated oscillator circuit 12. For example, in one embodiment, the compensation circuit 14 causes the frequency range of the oscillator signal to include both 266 MHz and 333 MHz for Vdd=2.5 V±10%, Vss=0, operating temperature=–55° C.–+125° C., control voltage=0–2.5 V±10%, and over a wide range of component characteristics. Regarding the latter range, each component, such as a transistor, of the oscillator circuit 12 is designed to have desired characteristics, such as transistor gain and threshold. Unfortunately, manufacturing-process variations can cause the characteristics of the circuit 12 components to vary from desired levels. For example, variations in the channel dimensions and gate-dielectric thickness can vary a transistor's gain. But because the oscillator and compensation circuits 12 and 14 are formed on the same IC die, they are subjected to the same process variations. Consequently, the process-induced component-characteristic variations in the circuit 14 components are respectively similar to the variations in the circuit 12 components. Therefore, as discussed below in conjunction with FIG. 3, the circuit 14 exploits these similarities to effectively cancel the unwanted effects that the variations in the circuit 12 components have on the frequency range of the oscillator signal.

Figure 2:
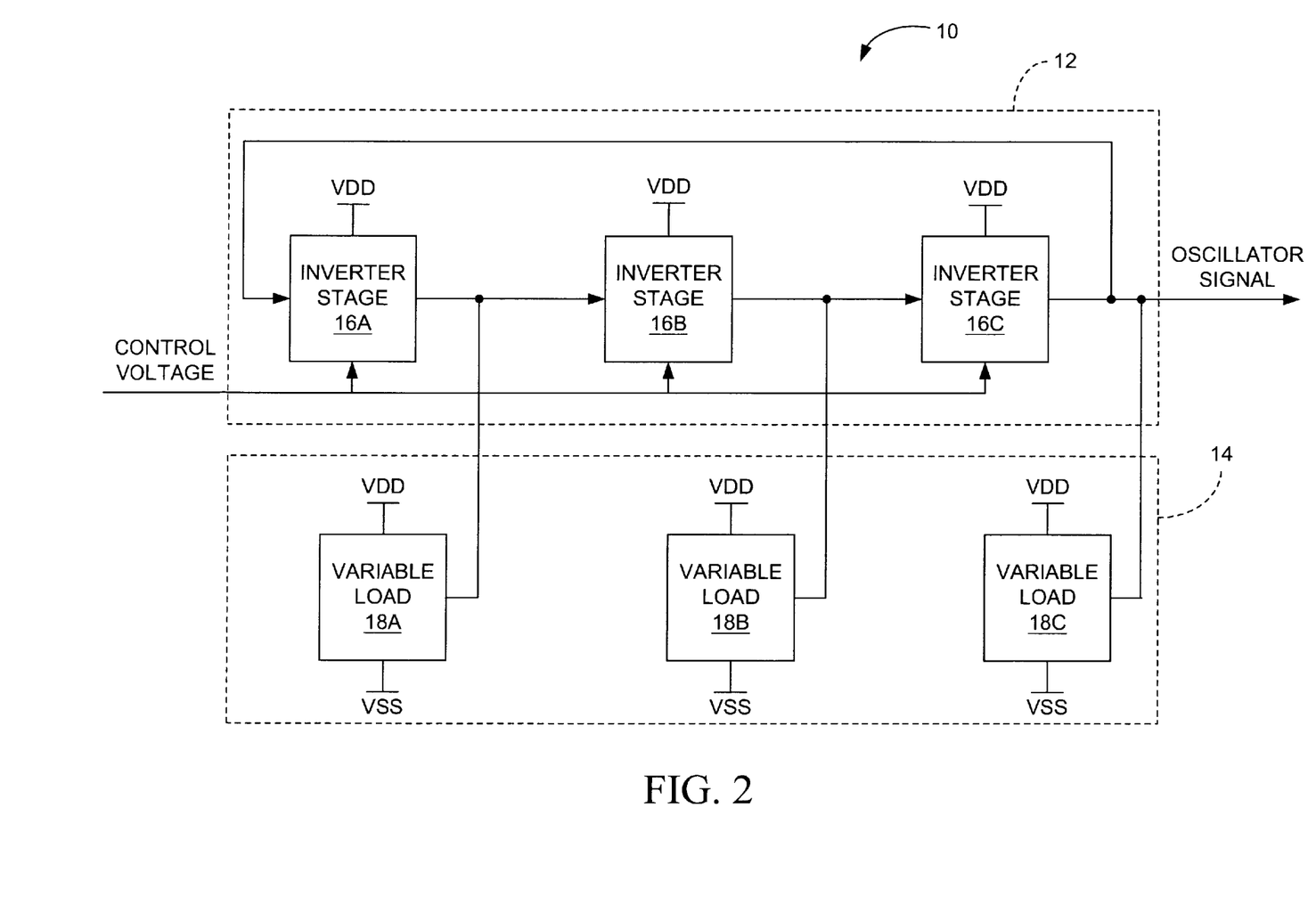
FIG. 2 is a detailed block diagram of the oscillator of FIG. 1 according to an embodiment of the invention.

FIG. 2 is a detailed block diagram of the oscillator 10 of FIG. 1 according to an embodiment of the invention. The oscillator circuit 12 includes an odd number, here three, of serially coupled inverter stages 16a–16c. The last stage 16c generates the oscillator signal, which is fed back to the first stage 16a to make the circuit 12 oscillate. The compensation circuit 14 includes variable loads 18a–18c, which have compensation terminals that are respectively coupled to the output terminals of the stages 16a–16c. Although in this embodiment there is a one-to-one correspondence between the stages 16 and the loads 18, in other embodiments there may be more or fewer than one load 18 per stage 16.

In operation, the variable loads 18a–18c stabilize the frequency range of the oscillator signal by counteracting of variations in the operating and component characteristics of the oscillator circuit 12. Specifically, if variations in temperature, supply voltage, or component characteristics speed up the stages 16a–16c and thus shift the frequency range of the oscillator signal upwards in the frequency spectrum, the loads 18a–18c increase the respective capacitances at the output terminals of the stages 16a–16c. These capacitance increases tend to slow down the stages 16a–16c and thus shift the frequency range of the oscillator signal downwards in the frequency spectrum. Consequently, the downward frequency shift caused by the loads 18a–18c counteracts the upward frequency shift caused by the variations in the operating and component characteristics of the stages 16a–16c. Conversely, if operating or component variations slow down the stages 16a–16c and thus shift the frequency range of the oscillator signal downwards in the frequency spectrum, the variable loads 18a–18c decrease the respective capacitances at the output terminals of the stages 16a–16c. These capacitance decreases tend to speed up the stages 16a–16c and thus shift the frequency range of the oscillator signal upwards in the frequency spectrum. Consequently, the upward frequency shift caused by the loads 18a–18c counteracts the downward frequency shift caused by the operating or component variations in the stages 16a–16c. The net result is that the loads 18a–18c maintain the oscillator-signal frequency range at a relatively constant position within the frequency spectrum. In a similar manner, the loads 18a–18c maintain the bandwidth of the oscillator-signal frequency range at a relatively constant size.

"Speed up the stages 16a–16c" means causing the inverters 16a–16c to charge and discharge the capacitances at their respective output terminals more quickly. The output capacitance of an inverter 16 is the combination of the parasitic capacitance at the inverter's output terminal, the parasitic capacitance at the following inverter's input terminal, the compensation capacitance provided by the respective load 18, and any other capacitances coupled to the output terminal of the inverter 16.

Conversely, "slow down the stages 16a–16c" means causing the inverters 16a–16c to charge and discharge the capacitances at their respective output terminals more slowly.

Figure 3:
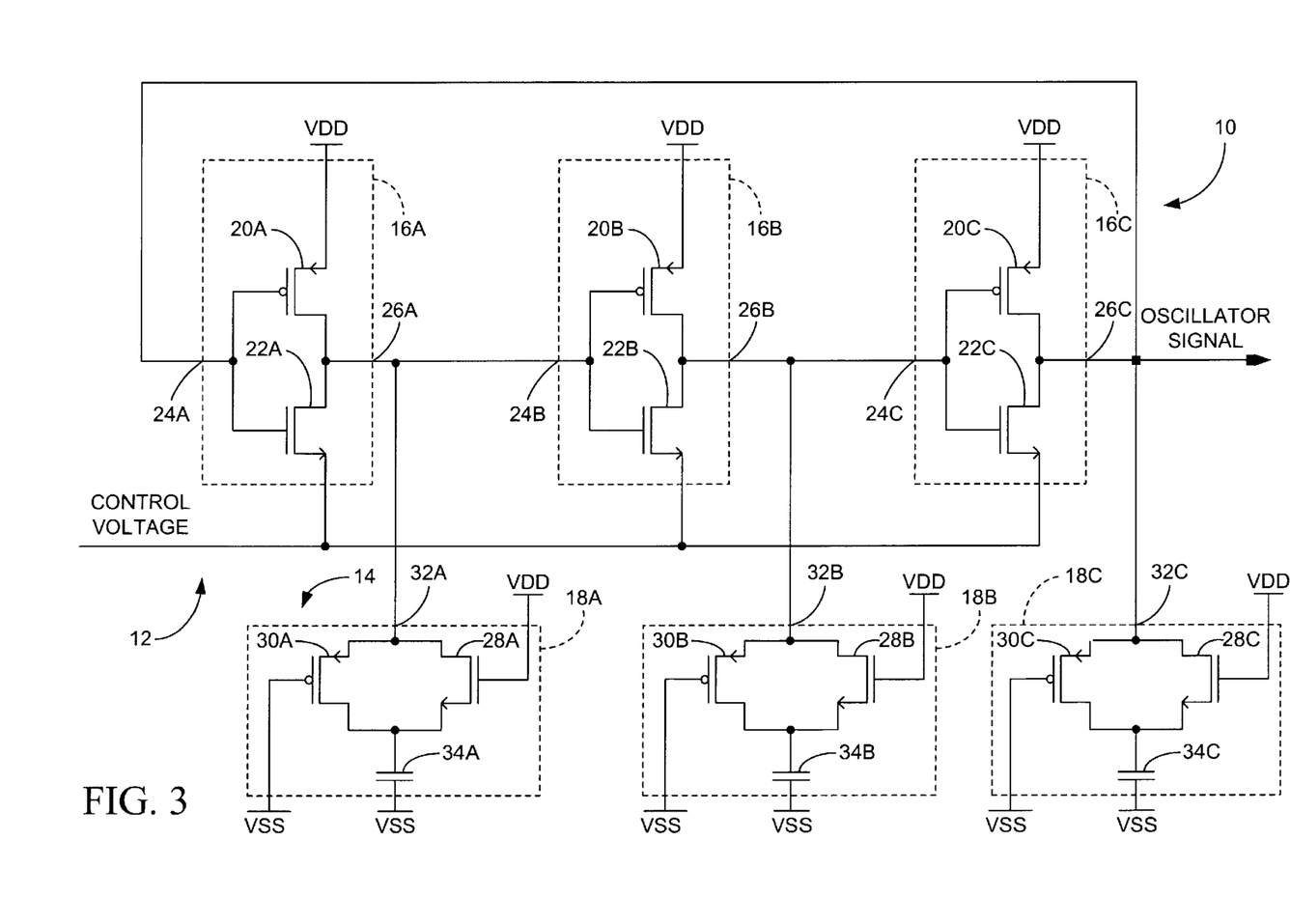
FIG. 3 is a schematic diagram of the oscillator of FIG. 2 according to an embodiment of the invention.

FIG. 3 is a schematic diagram of the oscillator 10 of FIG. 2 according to an embodiment of the invention. The inverter stages 16a–16c each respectively include a PMOS transistor 20 and an NMOS transistor 22 arranged in a push-pull configuration, an input terminal 24, and an output terminal 26. In one embodiment, each of the stages 16a–16c is balanced such that its input-voltage-equilibrium, i.e. "trip", point is approximately half way between Vdd and the control voltage, and each of the PMOS transistors 20a–20c and the NMOS transistors 22a–22c has a threshold of approximately 0.7 V. The variable loads 18a–18c each include an NMOS transistor 28 and a PMOS transistor 30 arranged in a pass-gate configuration, a compensation terminal 32 coupled to the output terminal 26 of a respective stage 16, and a load capacitor 34. Because the inverters 16a–16c and the loads 18a–18c are disposed on the same IC die, they are subjected to similar supply-voltage, temperature, and component-characteristic variations.

In operation, the variable loads 18a–18c stabilize the bandwidth and spectrum position of the oscillator-signal frequency range over supply voltage, temperature, and component-characteristic ranges that are significantly wider than the ranges provided by the uncompensated oscillator circuit 12. The loads 18a–18c perform this stabilization by counteracting changes in the bandwidth and spectrum position of the oscillator-signal frequency range caused by the effects that supply voltage, temperature, and component variations have on the inverter stages 16a–16c.

With respect to variations in supply voltage, an increase in Vdd causes the inverters 16a–16c to shift the oscillator-signal frequency range upward in the frequency spectrum, and a decrease in Vdd causes the inverters 16a–16c to shift the oscillator-signal frequency range downward. Specifically, it is known that for a given control voltage, an increase in Vdd increases the speed at which the inverters 16a–16c respectively charge and discharge the parasitic capacitors (not shown) at the output terminals 26a–26c, and thus increases the frequency of the oscillator signal. Consequently, over a range of control voltages, an increase in Vdd shifts the frequency range of the oscillator signal upward in the frequency spectrum. Likewise, a decrease in Vdd decreases the charge/discharge speed of the inverters 16a–16c, and thus shifts the frequency range of the oscillator signal downward in the frequency spectrum.

Conversely, an increase in (Vdd–Vss) across the loads 18a–18c shifts the oscillator-signal frequency range downward in the frequency spectrum, and a decrease in the supply voltage across the loads 18a–18c shifts the oscillator-signal frequency range upward. Specifically, an increase in the supply voltage decreases the resistance of the transistors 28a–28c and 30a–30c, and thus increases the coupling between the inverter output terminals 26a–26c and the capacitors 34a–34c. This increased coupling increases the capacitive loading on the terminals 26a–26c, and thus slows down the inverters 16a–16c because they need more time to charge and discharge the respective increased capacitive loads. Thus, for a given control voltage an increase in capacitive loading decreases the frequency of the oscillator signal. Consequently, over a range of control voltages, an increase in capacitive loading shifts the frequency range of the oscillator signal downward in the frequency spectrum. Likewise a decrease in the supply voltage across the loads 18a–18c decreases the capacitive loading on the inverters 16a–16c, and thus shifts the frequency range of the oscillator signal upward in the frequency spectrum.

Therefore, the loads 18a–18c counteract the shift in the oscillator-signal frequency range caused by the inverters 16a–16c. Specifically, for an increase in Vdd, the downward frequency-range shift caused by the loads 18a–18c partially or fully cancels the upward shift caused by the inverters 16a–16c. Similarly, for decreases in Vdd, the upward frequency-range shift caused by the loads 18a–18c partially or fully cancels the downward shift caused by the inverters 16a–16c.

With respect to variations in temperature, an increase in temperature causes the inverters 16a–16c to shift the oscillator-signal frequency range downward in the frequency spectrum, and a decrease in temperature causes the inverters 16a–16c to shift the frequency range of the oscillator-signal upward. Specifically, it is known that an increase in temperature increases the on resistances of the PMOS transistors 20a–20c and the NMOS transistors 22a–22c. These resistance increases raise the RC time constants that the transistor on resistances form with the respective capacitances at the output terminals 26a–26c. For a given control voltage, the raising of these RC time constants decreases the speed at which the inverters 16a–16c respectively charge and discharge the capacitances at the output terminals 26a–26c, and thus decreases the frequency of the oscillator signal. Consequently, over a range of control voltages, an increase in temperature shifts the frequency range of the oscillator signal downward in the frequency spectrum. Likewise, a decrease in temperature increases the charge/discharge speed of the inverters 16a–16c, and thus shifts the frequency range of the oscillator signal upward in the frequency spectrum.

Conversely, an increase in temperature causes the loads 18a–18c to shift the oscillator-signal frequency range upward in the frequency spectrum, and a decrease in temperature causes the loads 18a–18c to shift the oscillator-signal frequency range downward. Specifically, an increase in temperature increases the on resistances of the transistors 28a–28c and 30a–30c, and thus decreases the coupling between the output terminals 26a–26c and the capacitors 34a–34c. This decreased coupling decreases the capacitive loading on the terminals 26a–26c, and thus speeds up the inverters 16a–16c because they need less time to charge and discharge the respective decreased capacitive loads. Thus, for a given control voltage, a decrease in capacitive loading increases the frequency of the oscillator signal. Consequently, over a range of control voltages, a decrease in capacitive loading shifts the frequency range of the oscillator signal upward in the frequency spectrum. Likewise a decrease in temperature increases the capacitive loading on the inverters 16a–16c, and thus shifts the frequency range of the oscillator signal downward in the frequency spectrum.

Therefore, as the temperature varies, the loads 18a–18c counteract the shift in the output-signal frequency range caused by the inverters 16a–16c. Specifically, for temperature increases, the upward frequency-range shift caused by the loads 18a–18c partially or fully cancels the downward shift caused by the inverters 16a–16c. Similarly, for temperature decreases, the downward frequency-range shift caused by the loads 18a–18c partially or fully cancels the upward shift caused by the inverters 16a–16c.

With respect to component-characteristic variations, variations in gate-dielectric thicknesses are discussed for example purposes, it being understood that other component-characteristic variations are analyzed in a similar manner.

An increase in the thicknesses of the transistor 20 and 22 gate dielectrics causes the inverters 16a–16c to shift the frequency range of the oscillator signal downward in the frequency spectrum, and a decrease in these gate-dielectric thicknesses causes the inverters 16a–16c to shift the frequency range of the oscillator signal upward. Specifically, it is known that an increase in gate-dielectric thickness increases the on resistances of the PMOS transistors 20a–20c and the NMOS transistors 22a–22c for a given gate voltage. These resistance increases raise the RC time constants that the transistor on resistances form with the respective capacitances at the output terminals 26a–26c. The raising of these RC time constants decrease the speed at which the inverters 16a–16c respectively charge and discharge the capacitances at the output terminals 26a–26c, and thus, for a given control voltage, decreases the frequency of the oscillator signal. Consequently, assuming a range of control voltages, an increase in the thicknesses of the transistor 20 and 22 gate dielectrics shifts the frequency range of the oscillator signal downward in the frequency spectrum. Likewise, a decrease in the thicknesses of the transistor 20 and 22 gate dielectrics increases the charge/discharge speed of the inverters 16a–16c, and thus shifts the frequency range of the oscillator signal upward in the frequency spectrum.

Conversely, an increase in the thicknesses of the transistor 28 and 30 gate dielectrics causes the loads 18a–18c to shift the frequency range of the oscillator signal upward in the frequency spectrum, and a decrease in the thicknesses of these gate dielectrics causes the loads 18a–18c to shift the output-signal frequency range downward. Specifically, an increase in the thicknesses of the transistor gate dielectrics increases the on resistances of the transistors 28a–28c and 30a–30c for a given gate voltage, and thus decreases the coupling between the output terminals 26a–26c and the capacitors 34a–34c. This decreased coupling decreases the capacitive loading on the terminals 26a–26c, and thus speeds up the inverters 16a–16c because they need less time to charge and discharge the increased capacitances. Thus, for a given control voltage, a decrease in capacitive loading increases the frequency of the oscillator signal. Consequently, over a range of control voltages, a decrease in capacitive loading shifts the frequency range of the oscillator signal upward in the frequency spectrum. Likewise a decrease in the thickness of the transistor 28 and 30 gate dielectrics increases the capacitive loading on the inverters 16a–16c, and thus shifts the frequency range of the oscillator signal downward in the frequency spectrum.

Therefore, as the thicknesses vary, the loads 18a–18c counteract the shift in the frequency range of the oscillator signal caused by the inverters 16a–16c. Specifically, for increases in the gate-dielectric thicknesses, the upward shift in the frequency range caused by the loads 18a–18c partially or fully cancels the downward shift caused by the inverters 16a–16c. Similarly, for decreases in the gate-dielectric thicknesses, the downward shift in the frequency range caused by the loads 18a–18c partially or fully cancels the upward shift caused by the inverters 16a–16c.

Still referring to FIG. 3, although in the described embodiment of the oscillator 10 the transistors 20, 22, 28 and 30 are MOS transistors, in other embodiments some are all of these transistors may be bipolar transistors.

Furthermore, in one embodiment, the capacitors 34a–34c are respective transistors each having its gate coupled to the respective transistors 28 and 30, having its source and drain regions coupled to Vss, and having a value of approximately 1 picofarad (pF). In an example of this embodiment, the transistors used to form the capacitors 34a–34c have channel lengths (l)=0.9 microns ($\mu$m) and respective channel widths (w)=6, 9, and 12 $\mu$m. In another embodiment, the transistors 20, 22, 28, and 30 have the following channel widths w and lengths l: transistors 20a–20c, w=4, 6, and 8 $\mu$m, respectively, and l=0.9 $\mu$m; transistors 22a–22c, w=2, 3, and 4 $\mu$m, respectively, and l=0.45 $\mu$m; transistors 28a–28c, w=2 $\mu$m, and l=1.8 $\mu$m; transistors 30a–30c, w=4 $\mu$m, and l=1.8 $\mu$m. With these values, the resistances of the pass gates formed by the transistors 28 and 30 range from approximately 7 k$\Omega$–14 k$\Omega$ for Vdd=2.5 V±10%, Vss=0, operating temperature=–55° C.–+125° C., control voltage=0–2.5 V±10%, and for the anticipated range of component-characteristic variations. Of course, this resistance range can vary depending on the CMOS process used to form the transistors 28 and 30.

In addition, although the loads 18a–18c are each described as including two transistors 28 and 30, in another embodiment the loads 18a–18c include only the transistor 28 or the transistor 30, but not both. Furthermore, although the variable loads 18a–18c may not perfectly counteract the shift in the location and size of the oscillator-signal frequency range caused by variations in supply voltage, temperature, or component-characteristics, in one embodiment they provide enough counteraction such that the oscillator circuit 12 can generate the oscillator signal at both 266 MHz and 333 MHz over specified ranges of the control voltage and these variations. Moreover, although the loads 18a–18c are shown coupled to the supply voltages Vdd and Vss, in other embodiments the loads are connected to one or more bias voltages. Such bias voltages are typically generated to track variations in supply voltage, temperature, or component-characteristics, and thus cause the loads 18a–18c to more accurately counteract the shift in the location and size of the oscillator-signal frequency range caused by variations in supply voltage, temperature, or component-characteristics.

Figure 4:
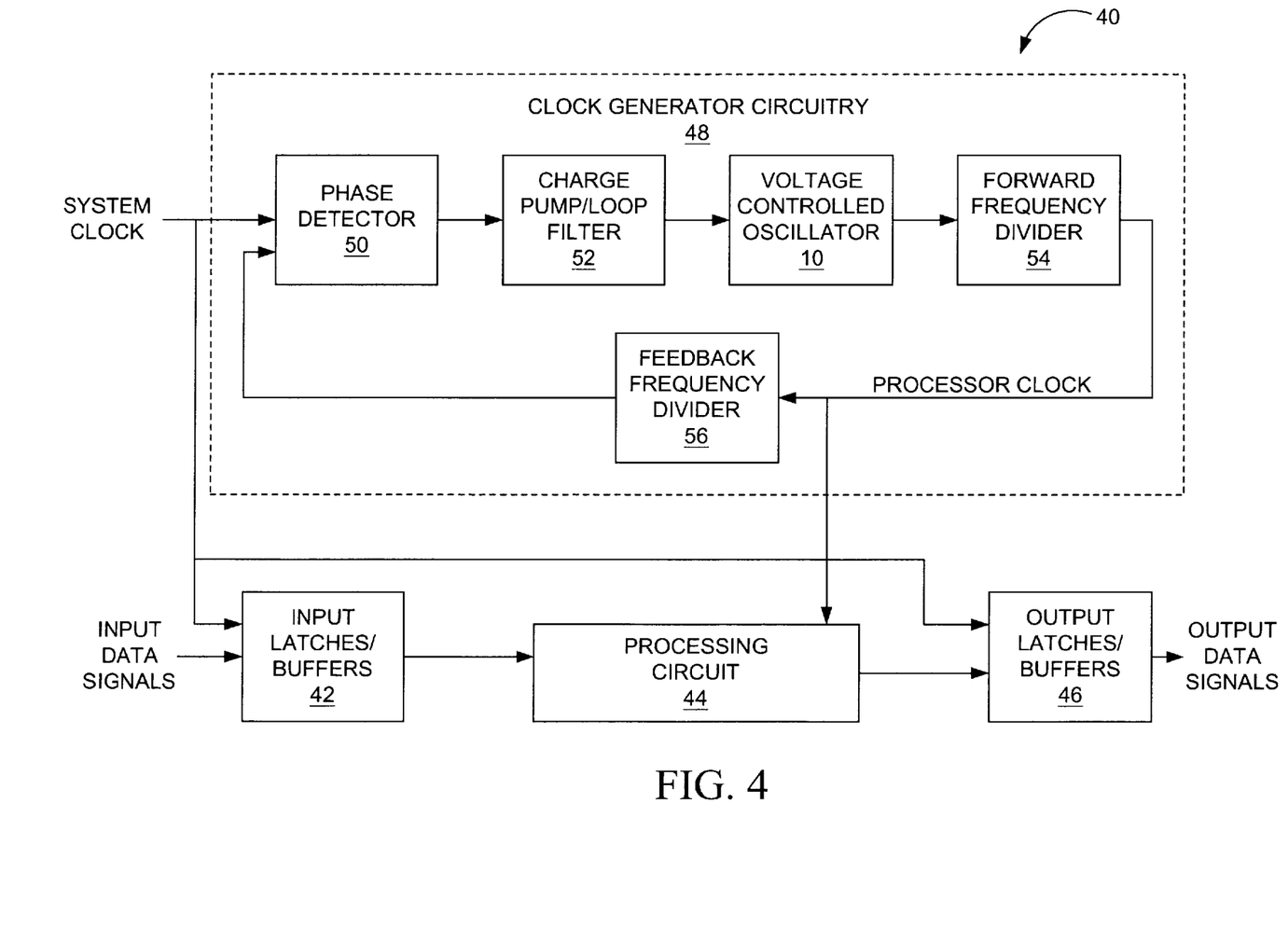
FIG. 4 is a block diagram of a processor that includes the oscillator of FIG. 1 according to an embodiment of the invention.

FIG. 4 is a block diagram of a processor 40, which includes the oscillator 10 of FIGS. 1 according to an embodiment of the invention. The processor 40 includes a bank 42 of conventional input latches and buffers for receiving and latching input data signals, a conventional processing circuit 44 for manipulating the input data signals, and a bank 46 of conventional output latches and buffers for latching the output data signals generated by the processing circuit 44 and for providing these output data signals to other circuitry (not shown in FIG. 4). The processor 40 also includes a phase-locked loop (PLL) 48 for generating a PROCESSOR CLOCK signal from a SYSTEM CLOCK signal. The PLL 48 includes a conventional phase detector 50 for generating an error signal that is proportional to the phase difference between SYSTEM CLOCK and PROCESSOR CLOCK or a derivative thereof. A conventional charge pump/loop filter 52 filters the error signal and generates the control signal that controls the frequency of the oscillator signal from the oscillator 10. To allow PROCESSOR CLOCK to have a lower frequency than the oscillator signal and an approximately 50% duty cycle, an optional and conventional forward frequency divider 54 generates PROCESSOR CLOCK at a lower frequency than the oscillator signal. To allow SYSTEM CLOCK to have a lower frequency than PROCESSOR CLOCK, an optional and conventional feedback frequency divider 56 reduces the frequency of PROCESSOR CLOCK to that of SYSTEM CLOCK.

Figure 5:
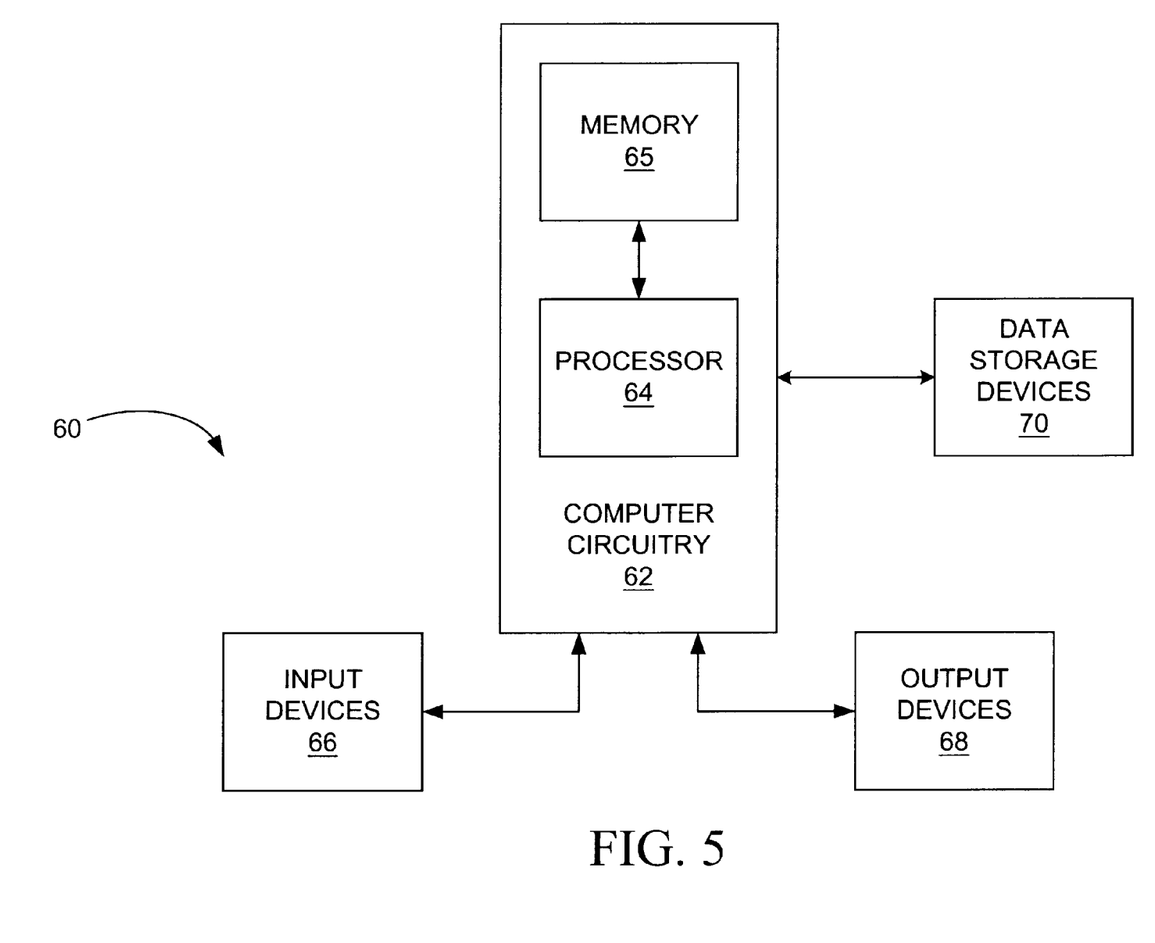
FIG. 5 is a block diagram of an electronic computer system that includes the processor of FIG. 4 according to an embodiment of the invention.

FIG. 5 is a block diagram of an electronic system 60, such as a computer system, that includes the processor 40 of FIG. 4 according to an embodiment of the invention. The system 60 includes computer circuitry 62 for performing computer functions, such as executing software to perform desired calculations and tasks. The circuitry 62 typically includes the processor 64 and a memory circuit 65, which is coupled to the processor 64. One or more input devices 66, such as a keyboard or a mouse, are coupled to the computer circuitry 62 and allow an operator (not shown) to manually input data thereto. One or more output devices 68 are coupled to the computer circuitry 62 to provide to the operator data generated by the computer circuitry 62. Examples of such output devices 68 include a printer and video display unit. One or more data-storage devices 70 are coupled to the computer circuitry 62 to store data or retrieve data from external storage media (not shown). Examples of the storage devices 70 and the corresponding storage media include drives that accept hard and floppy disks, tape cassettes, and compact disk read-only memories (CD-ROMs). Typically, the computer circuitry 62 includes address data and command buses and a clock line (not shown) that are respectively coupled to the memory circuit 65.

From the foregoing it will be appreciated that, although specific embodiments of the invention have been described herein for purposes of illustration, various modifications may be made without deviating from the spirit and scope of the invention.

What is claimed is:

1. An oscillator, comprising:
  an oscillator circuit operable to receive a control signal having a signal level and to generate an oscillator signal having a frequency that is proportional to the signal level and that is within a frequency range; and
  a compensation circuit coupled to the oscillator circuit and operable to stabilize the oscillator circuit independently of and without altering the control signal by capacitively loading the oscillator circuit such that the frequency range includes first and second predetermined frequencies.

2. The oscillator of claim 1 wherein:
  the signal level is within a signal-level range having upper and lower signal levels;
  the frequency range has upper and lower frequencies; and
  the oscillator circuit is operable to generate the oscillator signal having,
    the upper frequency if the control signal has the lower signal level, and
    the lower frequency If the control signal has the upper signal level.

3. The oscillator of claim 1 wherein the compensation circuit is operable to stabilize the oscillator circuit over a predetermined temperature range.

4. The oscillator of claim 1 wherein:
  the oscillator circuit is operable to receive a power signal having a power-signal level; and
  the compensation circuit is operable to stabilize the oscillator circuit over a predetermined range of power-signal levels.

5. The oscillator of claim 1 wherein the first and second predetermined frequencies are approximately equal to 266 MHz and 333 MHz, respectively.

6. The oscillator of claim 1 wherein the signal level comprises a voltage level.

7. An oscillator, comprising:

an oscillator output terminal;

an oscillator stage having an input terminal, an output terminal coupled to the oscillator output terminal, a first transistor having a control terminal coupled to the input terminal and having a first drive terminal coupled to the output terminal, and a second complimentary transistor having a control terminal coupled to the input terminal and having a first drive terminal coupled to the output terminal; and a compensation stage having first and second supply terminals that are respectively operable to receive first and second power-supply voltages and having a compensation terminal coupled to the output terminal of the oscillator stage.

8. The oscillator of claim 7 wherein:

the first and second transistors comprise respective second drive terminals;

the oscillator stage has a supply terminal coupled to the second drive terminal of the first transistor; and the oscillator stage has a control terminal coupled to the second drive terminal of the second transistor.

9. The oscillator of claim 7 wherein the compensation stage comprises a variable impedance.

10. The oscillator of claim 7 wherein the compensation stage comprises a variable resistance serially coupled between one of the supply terminals and the compensation terminal.

11. An oscillator, comprising:

an oscillator output terminal;

an oscillator stage having an output terminal coupled to the oscillator output terminal; and a compensation stage having first and second supply terminals that are respectively operable to receive first and second power-supply voltages, a compensation terminal coupled to the output terminal of the oscillator stage, and a capacitor serially coupled between one of the supply terminals and the compensation terminal.

12. An oscillator, comprising:

an oscillator output terminal;

an oscillator stage having an output terminal coupled to the oscillator output terminal; and a compensation stage having first and second supply terminals that are respectively operable to receive first and second power-supply voltages, a compensation terminal coupled to the output terminal of the oscillator stage, and a transistor having a control terminal coupled to the first supply terminal, a first drive terminal coupled to the compensation terminal, and a second drive terminal coupled to the second supply terminal.

13. An oscillator, comprising:

an oscillator output terminal;

an oscillator stage having an output terminal coupled to the oscillator output terminal; and a compensation stage having first and second supply terminals that are respectively operable to receive first and second power-supply voltages, a compensation terminal coupled to the output terminal of the oscillator stage, a transistor having a control terminal coupled to the first supply terminal, a first drive terminal coupled to the compensation terminal, and a second drive terminal, and a capacitor coupled between the second drive terminal of the transistor and the second supply terminal.

14. An oscillator, comprising:

an oscillator output terminal;

an oscillator stage having an output terminal coupled to the oscillator output terminal; and a compensation stage having first and second supply terminals that are respectively operable to receive first and second power-supply voltages, a compensation terminal coupled to the output terminal of the oscillator stage, a first transistor having a control terminal coupled to the first supply terminal, a first drive terminal coupled to the compensation terminal, and a second drive terminal, a second transistor having a control terminal coupled to the second supply terminal, a first drive terminal coupled to the compensation terminal, and a second drive terminal, and a capacitor having a first terminal coupled to the second drive terminals of the first and second transistors and having a second terminal coupled to the second supply terminal.

15. An oscillator, comprising:

first and second oscillator supply terminals operable to receive respective first and second power-supply voltages;

an oscillator output terminal;

an oscillator control terminal;

a first oscillator stage having an input terminal coupled to the oscillator output terminal, a supply terminal coupled to the first oscillator supply terminal, a control terminal coupled to the oscillator control terminal, an output terminal, and a transistor having a control node coupled to the input terminal, a first drive terminal coupled to the output terminal, and a second drive terminal coupled to the control terminal;

a second oscillator stage having an input terminal coupled to the output terminal of the first oscillator stage, a supply terminal coupled to the first oscillator supply terminal, a control terminal coupled to the oscillator control terminal, an output terminal, and a transistor having a control node coupled to the input terminal, a first drive terminal coupled to the output terminal, and a second drive terminal coupled to the control terminal;

a third oscillator stage having an input terminal coupled to the output terminal of the second oscillator stage, a supply terminal coupled to the first oscillator supply terminal, a control terminal coupled to the oscillator control terminal, an output terminal coupled to the oscillator output terminal, and a transistor having a control node coupled to the input terminal, a first drive terminal coupled to the output terminal, and a second drive terminal coupled to the control terminal;

a first compensation stage having a compensation terminal coupled to the output terminal of the first oscillator stage and having first and second control terminals respectively coupled to the first and second oscillator supply terminals;

a second compensation stage having a compensation terminal coupled to the output terminal of the second oscillator stage and having first and second control terminals respectively coupled to the first and second oscillator supply terminals; and a third compensation stage having a compensation terminal coupled to the output terminal of the third oscillator stage and having first and second control terminals respectively coupled to the first and second oscillator supply terminals.

16. The oscillator of claim 15 wherein the first, second, and third oscillator stages comprise first, second, and third inverters, respectively.

17. An oscillator, comprising:

first and second oscillator supply terminals operable to receive respective first and second power-supply voltages;

an oscillator output terminal;

an oscillator control terminal;

a first oscillator stage having an input terminal coupled to the oscillator output terminal, a supply terminal coupled to the first oscillator supply terminal, a control terminal coupled to the oscillator control terminal, and an output terminal;

a second oscillator stage having an input terminal coupled to the output terminal of the first oscillator stage, a supply terminal coupled to the first oscillator supply terminal, a control terminal coupled to the oscillator control terminal, and an output terminal;

a third oscillator stage having an input terminal coupled to the output terminal of the second oscillator stage, a supply terminal coupled to the first oscillator supply terminal, a control terminal coupled to the oscillator control terminal, and an output terminal coupled to the oscillator output terminal;

a first compensation stage having a compensation terminal coupled to the output terminal of the first oscillator stage and having first and second control terminals respectively coupled to the first and second oscillator supply terminals;

a second compensation stage having a compensation terminal coupled to the output terminal of the second oscillator stage and having first and second control terminals respectively coupled to the first and second oscillator supply terminals;

a third compensation stage having a compensation terminal coupled to the output terminal of the third oscillator stage and having first and second control terminals respectively coupled to the first and second oscillator supply terminals; and wherein each of the first, second, and third compensation stages respectively comprises,
- a first transistor having a gate coupled to the first control terminal, a source/drain coupled to the compensation terminal, and a drain/source,
- a second transistor having a gate coupled to the second control terminal, a drain/source coupled to the compensation terminal, and a source/drain, and
- a capacitor having a first terminal coupled to the drain/source of the first transistor and the source/drain of the second transistor, and having a second terminal coupled to the second supply terminal.

18. A phase-locked loop, comprising:

a phase detector operable to receive a clock signal having a clock frequency and an oscillator signal having an oscillator frequency and operable to generate an error signal having a signal level that is proportional to the difference between the clock and oscillator frequencies; and an oscillator coupled to the phase detector and including,
- an oscillator circuit operable to generate the oscillator signal such that the oscillator frequency is proportional to the signal level of the error signal and is within a frequency range, and
- a compensation circuit coupled to the oscillator circuit and operable to stabilize the oscillator circuit independently of and without modifying the error signal by capacitively loading the oscillator circuit such that the frequency range includes first and second predetermined frequencies.

19. The phase-locked loop of claim 18 wherein the first and second predetermined frequencies are approximately equal to 266 MHz and 333 MHz, respectively.

20. The phase-locked loop of claim 18 wherein the signal level of the error signal comprises a voltage level.

21. The phase-locked loop of claim 18, further comprising a frequency divider coupled to the phase detector and to the oscillator and operable to reduce the oscillator frequency of the oscillator signal generated by the oscillator and to provide the oscillator signal having the reduced oscillator frequency to the phase detector.

22. A processor, comprising:

a processing circuit operable to receive a processor clock signal having a processor-clock frequency; and a phase-locked loop coupled to the processing circuit and operable to receive a system clock signal having a system-clock frequency, the phase-locked loop including,
- a phase detector operable to generate an error signal having a signal level that is proportional to the difference between the system-clock and processor-clock frequencies, and
- an oscillator coupled to the phase detector and including,
  - an oscillator circuit operable to generate the processor clock signal such that the processor-clock frequency is proportional to the signal level of the error signal and is within a frequency range, and
  - a compensation circuit coupled to the oscillator circuit and operable to stabilize the oscillator circuit independently of and without modifying the error signal by capacitively loading the oscillator circuit such that the frequency range includes first and second predetermined processor-clock frequencies.

23. An electronic system, comprising:

a data input device;

a data output device; and a computer circuit coupled to the data input and output devices and including a processor that comprises,
- a processing circuit operable to receive a processor clock signal having a processor-clock frequency, and
- a phase-locked loop coupled to the processing circuit and operable to receive a system clock signal having a system-clock frequency, the phase-locked loop including,
  - a phase detector operable to generate an error signal having a signal level that is proportional to the difference between the system-clock and processor-clock frequencies, and
  - an oscillator coupled to the phase detector and including,
    - an oscillator circuit operable to generate the processor clock signal such that the processor-clock frequency is proportional to the signal level of the error signal and is within a frequency range, and
    - a compensation circuit coupled to the oscillator circuit and operable to stabilize the oscillator circuit independently of and without modifying the error signal by capacitively loading the oscillator circuit such that the frequency range includes first and second predetermined processor-clock frequencies.

24. A method, comprising:

generating a signal having a frequency that corresponds to a control-signal level and that is within a frequency range; and stabilizing the frequency range independently of and without altering the control-signal level by adjusting the coupling between the signal and a capacitor such that the frequency range includes first and second predetermined frequencies.

25. The method of claim 24 wherein the control-signal level comprises a control-signal voltage.

26. The method of claim 24 wherein the stabilizing comprises stabilizing the size of the frequency range.

27. The method of claim 24 wherein the stabilizing comprises stabilizing the position of the frequency range within the frequency spectrum.

28. The method of claim 24 wherein the stabilizing comprises stabilizing the frequency range with respect to temperature.

29. The method of claim 24 wherein the stabilizing comprises stabilizing the frequency range with respect to supply voltage.

30. The method of claim 24 wherein the stabilizing comprises stabilizing the frequency range with respect to component parameters.

31. The method of claim 24 wherein the first and second predetermined frequencies are approximately equal to 266 MHz and 333 MHz, respectively.

32. A method, comprising:

generating a signal at a node, the signal having a frequency that corresponds to a control-signal level and that is within a frequency range; and stabilizing the frequency range by using multiple power-supply voltages to control a value of an impedance that couples a capacitor to the node such that the frequency range includes first and second predetermined frequencies.

33. An oscillator, comprising:

an oscillator circuit operable to receive a control signal having a signal level within a range of signal levels and to generate an oscillator signal having a frequency that corresponds to the signal level; and a compensation circuit coupled to the oscillator circuit and operable to stabilize the oscillator circuit independently of and without modifying the control signal by capacitively loading the oscillator circuit such that the range of signal levels allows the oscillator signal to have a frequency range that includes first and second predetermined frequencies.

* * * * *